United States Patent
Jiang et al.

[11] Patent Number: 5,774,486
[45] Date of Patent: Jun. 30, 1998

[54] WAVEGUIDE POWER MONITORING SYSTEM FOR VERTICAL CAVITY SURFACE EMITTING LASERS

[75] Inventors: Wenbin Jiang, Phoenix; Michael S. Lebby, Apache Junction, both of Ariz.

[73] Assignee: Motorola, Inc., Schaumburg, Ill.

[21] Appl. No.: 641,256

[22] Filed: Apr. 30, 1996

[51] Int. Cl.[6] .............................. H01S 3/13; H01S 3/00; G02B 6/26; G02B 6/36

[52] U.S. Cl. ............................. 372/31; 372/33; 385/45; 385/48; 385/49; 385/88

[58] Field of Search .............................. 372/29, 31, 33, 372/50, 96, 109; 385/14, 45, 48, 49, 88, 129–133

[56] References Cited

U.S. PATENT DOCUMENTS

| | | | |
|---|---|---|---|
| 4,821,273 | 4/1989 | Hori | 372/31 |
| 5,214,725 | 5/1993 | Yanagawa et al. | 385/131 |
| 5,271,083 | 12/1993 | Lebby et al. | 385/130 |
| 5,282,217 | 1/1994 | Yamazaki | 372/31 |
| 5,475,701 | 12/1995 | Hibbs-Brenner | 372/50 |

FOREIGN PATENT DOCUMENTS

| | | | |
|---|---|---|---|
| 5-315694 | 11/1993 | Japan | 372/29 |

*Primary Examiner*—Rodney B. Bovernick
*Assistant Examiner*—Luong-Quyen T. Phan
*Attorney, Agent, or Firm*—Eugene A. Parsons

[57] ABSTRACT

A power monitoring system including a vertical cavity surface emitting laser generating an emission. A beam splitter optically positioned to receive the emission and split the emission into a first portion and a second portion. A monitor optically positioned to receive the first portion of the emission. An output of the monitor is used to control emissions of the vertical cavity surface emitting lasers.

10 Claims, 2 Drawing Sheets

5,774,486

WAVEGUIDE POWER MONITORING SYSTEM FOR VERTICAL CAVITY SURFACE EMITTING LASERS

FIELD OF THE INVENTION

The present invention pertains to vertical cavity surface emitting lasers.

More particularly, the present invention pertains to power monitoring of vertical cavity surface emitting lasers.

Further and more specifically, the present invention pertains to auto power controlled vertical cavity surface emitting lasers.

BACKGROUND OF THE INVENTION

Since the development of laser diodes, many applications for their use have been developed. Increasingly, laser diodes are employed for communications and are integral to optical disc recording and storage systems. Typically, edge emitting diode lasers are used. Edge emitting diode lasers, however, have a high cost in parallel and serial data links, and have a high current drain due to a high threshold current when used in compact disc pickups.

New systems are being developed to employ vertical cavity surface emitting lasers (VCSEL) in place of edge emitting lasers. The VCSELs provide a much lower cost, use surface emissions which simplify optical devices and are capable of being fabricated in larger volumes on semiconductor wafers. However, during use, temperature fluctuations and degradation of the VCSEL device cause fluctuations in the emissions. These fluctuations cause errors in data retrieval and furthermore the threshold level may increase, thereby requiring more power input to sustain lasing. Edge emitting laser diodes employ a power monitoring detector facing the back emission facet of the device. In a VCSEL, there are no back emissions due to the construction of the mirror stacks and the opaque substrate on which the device is necessarily formed.

It would be highly advantageous, therefore, to remedy the foregoing and other deficiencies inherent in the prior art.

Therefore it is desirable that a system be developed for monitoring the emissions of a VCSEL.

Accordingly, it is an object of the present invention to provide a power monitoring system for a VCSEL.

Another object of the present invention is to provide a power monitoring system which will automatic control the emissions.

And another object of the present invention is to provide an inexpensive and easily fabricated power monitor system and automatic power control.

SUMMARY OF THE INVENTION

Briefly, to achieve the desired objects of the instant invention, in accordance with a preferred embodiment thereof, provided is a power monitoring system including a vertical cavity surface emitting laser generating an emission. A beam splitter optically positioned to receive the emission and split the emission into a first portion and a second portion. A monitor is optically positioned to receive the first portion of the emission.

In another embodiment, a power monitoring system is provided which includes a vertical cavity surface emitting laser generating an emission. A waveguide having an inlet optically coupled to the vertical cavity surface emitting laser, the inlet receiving the emission from the vertical cavity surface emitting laser, and first and second outlets each providing a portion of the emission received at the inlet. A monitor is optically coupled to the waveguide to receive the portion of the emission at the second outlet.

In accordance with a further embodiment of the invention, a method of fabricating a power monitoring system is provided, including the steps of providing a vertical cavity surface emitting laser and generating an emission from the vertical cavity surface emitting laser. Splitting the emission into a first portion and a second portion, and positioning a monitor to receive the first portion of the emission.

BRIEF DESCRIPTION OF THE DRAWINGS

The foregoing and further and more specific objects and advantages of the instant invention will become readily apparent to those skilled in the art from the following detailed description of preferred embodiments thereof taken in conjunction with the drawings in which.

DETAILED DESCRIPTION OF THE PREFERRED EMBODIMENT

Figure 1:
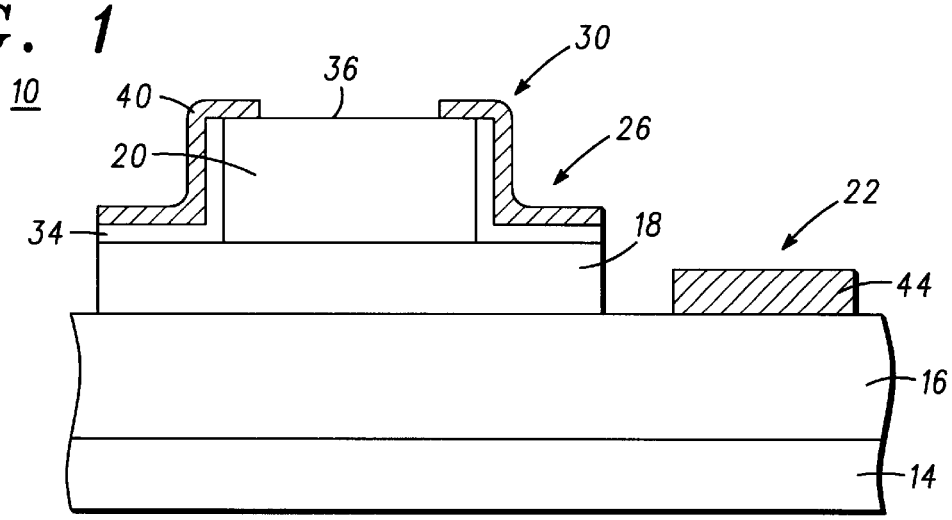
FIG. 1 is a simplified cross-sectional view of a vertical cavity surface emitting laser.

Turning now to the drawings in which like reference characters indicate corresponding elements throughout the several views, attention is first directed to FIG. 1 which illustrates a vertical cavity surface emitting laser (VCSEL) generally designated 10 and formed on a substrate 14. A specific VCSEL 10 is illustrated only for purposes of this disclosure and it should be understood that many different types of VCSEL might be utilized, including planar, ridge, completely etched from the substrate, etc. In this embodiment VCSEL 10 is fabricated by epitaxially growing a first mirror stack 16 on the top surface of substrate 14. Mirror stack 16 includes a plurality of layers of semiconductor material with alternating indexes of refraction. Some examples of materials that can be used for this purpose are: alternating layers of $Al_{0.15}Ga_{0.85}As$ and $Al_{0.80}Ga_{0.20}As$; alternating layers of GaAs and $Al_{0.80}Ga_{0.20}As$; etc. Each pair of alternating layers are grown to an optical thickness of one quarter of the emission wavelength, propagating in the layers, and the number of pairs is chosen to provide as much reflectivity of light as possible while limiting the stack to a practical number. An active region 18 is grown on the upper surface of mirror stack 16, which includes one or more quantum wells separated by barrier layers with a spacer and/or cladding layer on either side thereof. The quantum wells and spacer layers are also grown epitaxially.

A second mirror stack 20 is formed on the upper surface of active region 18 by, for example, epitaxially growing pairs of semiconductor layers as described in conjunction with mirror stack 16. Generally, the pairs of layers will be formed of materials similar to those of mirror stack 16 and the thicknesses will be similar to provide the proper reflectivity of a selected wavelength or spectrum of wavelengths. Also, first and second mirror stacks 16 and 20 are doped with opposite conductivity types to form a two terminal (diode) structure for the flow of electrical current therethrough.

VCSEL 10 is defined by etching a trench 22 through second mirror stack 20 and active region 18 to separate VCSEL 10 and 12 and to define an outer boundary thereof. Trench 22 exposes an upper surface of first mirror stack 16 so that an electrical contact can be made to mirror stack 16. VCSEL 10 is further defined by patterning the structure as follows. The upper surface of mirror stack 20 is provided with a layer of photoresist alone or in combination with oxynitride material in any of the well known methods. The photo resist layer is exposed and material is removed to define the position and size of a trench 26. Trench 26 is then formed by etching mirror stack 20 by any convenient means such as, ion milling, dry etching, wet etching, etc. In general, trench 26 extends completely around and defines an operating area, or mesa 30 for VCSEL 10. Generally operating area, or mesa 30 has a circular cross-section.

In this specific embodiment trench 26 extends into mirror stack 20 from the upper surface thereof, approximately to the active region 18. While this depth is convenient for current limiting and etching techniques, it is only necessary that trench 26 be sufficiently deep to confine the current to the active region and to reduce reflectivity of mirror stack 20 in the volume between the bottom of trench 26 and active layer 18 so that a non-lasing volume is produced beneath trench 26. The non-lasing volume surrounds a lasing volume below mesa 30, which lasing volume is substantially coaxial with mesa 30. In at least some applications lasing will not be supported when the reflectivity is reduced to less than approximately 98%. A complete disclosure of the construction of ridge VCSELs is available in U.S. Pat. No. 5,256,596 entitled "Top Emitting VCSEL with Implant", issued Oct. 26, 1993 and assigned to the same assignee.

A dielectric layer 34 is formed on the surface of mesa 30. Dielectric layer 34 is patterned to define an emission window 36 for VCSEL 10. Also, a portion of the upper surface of mirror stack 16 adjacent mesa 30 is exposed. A first contact 40 for VCSEL 10 is formed on mesa 30 in contact with upper mirror stack 20. A second contact 44 for VCSEL 10 is formed on the upper surface of mirror stack 16 adjacent mesa 30. It should be understood that an electrical contact can be formed on the rear, or lower, side of substrate 14, instead of in the position of contact 44, if convenient.

The quantum wells of active regions 18 in VCSEL 10 produce photons (light) in accordance with a well known phenomenon when properly energized by electrical current applied thereacross. In general, the greater the current applied to active region 18, the greater the number of photons generated. The photons are reflected by mirror stack 16 and 20 in VCSELs 10 to produce the well known lasing effect that ultimately produces the emitted light.

Figure 2:
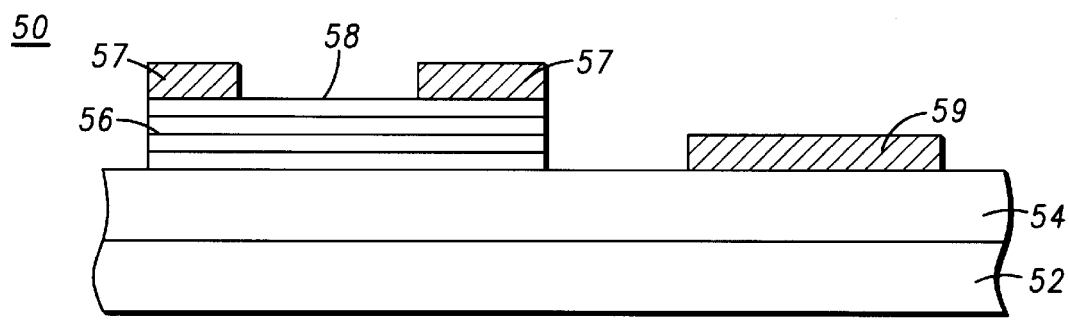
FIG. 2 is a simplified cross-sectional view of a photodiode.

Turning now to FIG. 2, a photodiode generally designated 50 is illustrated. While a specific photodiode is disclosed for purposes of this explanation, it will be understood that a variety of photosensitive diodes might be utilized. Photodiode 50 includes a second substrate 52 on which a mirror stack 54 is epitaxially grown. An active region 56 is epitaxially formed on the upper surface of mirror stack 54. A portion of active region 56 is etched to expose a surface of mirror stack 54. A first electrical contact 57 is formed on the surface of active region 56 defining a light receiving window 58, and a second electrical contact 59 is formed on the exposed surface of mirror stack 54. An electrical contact can be formed on the rear, or lower, side of substrate 52, instead of in the position of contact 59, if convenient. It should be understood that while a mirror stack can be utilized to improve the efficiency of photodiode 50, in many instances only an active region and cladding layers may be employed. Also, photodiode 50 has a specific sensitivity to light and generally must receive sufficient light to be within the sensitivity.

Figure 3:
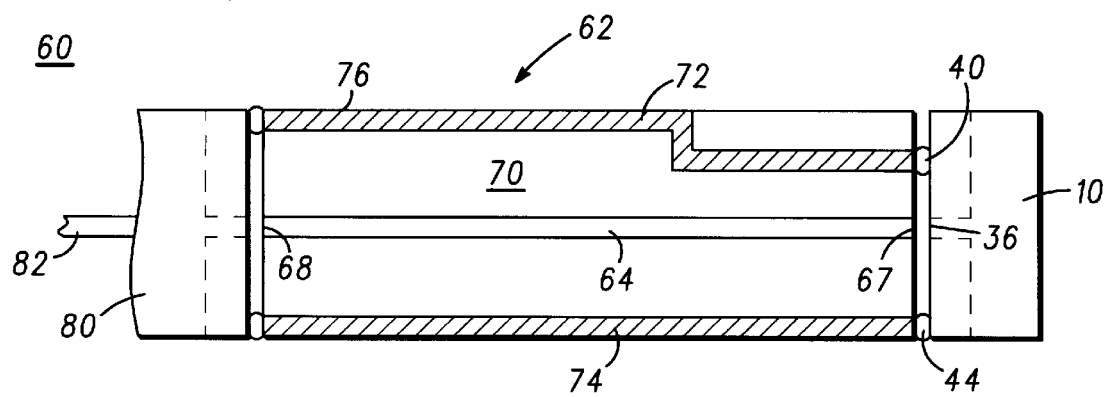
FIG. 3 is a simplified cross-sectional view of an optical waveguide with the vertical cavity surface emitting of FIG. 1 attached thereto.
Figure 4:
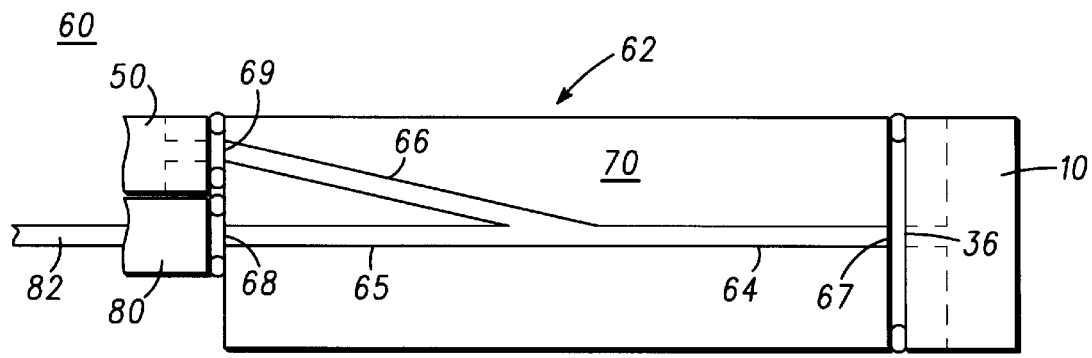
FIG. 4 is a simplified top sectional view of a power monitoring system in accordance with the present invention.

Referring now to FIGS. 3 and 4, a power monitoring system generally designated 60 is illustrated in cross-section and top section. System 60 includes an optical waveguide 62 with a split core or light channel 64 having a first or main branch 65 and a second branch 66. Channel 64 has a light input 67 at one end thereof, a light output 68 at the opposite end of main branch 65, and a light output 69 at the opposite end of branch 66. Channel 64 is defined by a surrounding cladding region 70 with channel 64 preferably filled with an optically clear polymer with a refractive index at least 0.01 higher than the material forming cladding region 70. In a preferred embodiment, optical waveguide 62 is molded of optically clear plastic, as described in U.S. Pat. No. 5,265,184, entitled "Molded Waveguide and Method for Making Same", issued Nov. 23, 1993 and U.S. Pat. No. 5,313,545, entitled "Molded Waveguide With a Unitary Cladding Region and Method of Making", issued May 17, 1994, and both assigned to the same assignee.

Referring specifically to FIG. 3, waveguide 62 includes first and second electrical conductors 72 and 74 molded into cladding region 70. Conductors 72 and 74 can be, for example, lead frames or the like. Each of the conductors 72 and 74 are positioned to engage contacts 40 and 44. respectively, of VCSEL 10 at one end of waveguide 62. Further, contacts 57 and 59 of photodiode 50 engage similar conductors. Exterior surface 76 is exposed to allow the mounting of electrical circuitry for the operation of the power monitoring system. Additional information as to waveguides with leadframes molded therein is available in U.S. Pat. No. 5,271,083, entitled "Molded Optical Waveguide with Contacts Utilizing Leadframes and Method of Making Same", issued Dec. 14, 1993, and assigned to the same assignee.

A fiber optic coupling 80 optically couples an optical fiber 82 to light output 68 of main branch 65. Photodiode 50 operates as a monitor and is optically coupled to waveguide 62 at light output 69. Window 58 of Photodiode 50 is optically aligned with light outlet 69. VCSEL 60 is coupled to waveguide 62 at light input 67. Window 36 of VCSEL 10 is optically aligned with light input 67 so as to emit light directly into core 64.

In operation, emissions from VCSEL 10 enter core 64 of waveguide 62 via input 67. The emission is split into a portion passing along branch 65 and a portion passing along branch 66. In the preferred embodiment, the splitting ratio of branch 66 and branch 65 is 1:9, although only a sufficient amount of the emission needs to be split from branch 65 to come within the sensitivity of a diode (diode 50 in this disclosure) being used as the monitor or detector, so that the portion passing along branch 66 is less than 10% of the emission from VCSEL 10. Approximately 90% of the emission is passed along branch 65. The asymmetrical splitting of the emission from VCSEL 10 is achieved by the divergent angle of branch 66 from branch 65. It should be understood however, that other means might be utilized for splitting a portion of the emission from the main branch, such as by use of an hologram or the like. The numerical of VCSEL 10 can be changed by varying the parameters of waveguide 62.

Figure 5:
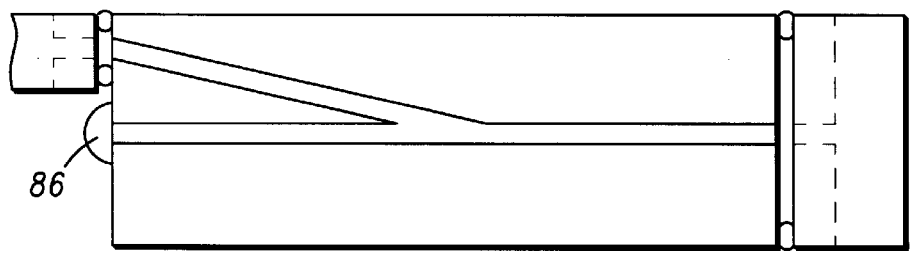
FIG. 5 is a view similar to FIG. 4 of another embodiment.

Referring to FIG. 5, another embodiment of a power monitoring system, generally designed 85, is illustrated.

System 85 is substantially similar to system 60 of FIG. 4, except that the optical coupling 80 has been replaced with a molded lens 86 coupled to light outlet 68 for beam collimation.

Figure 6:
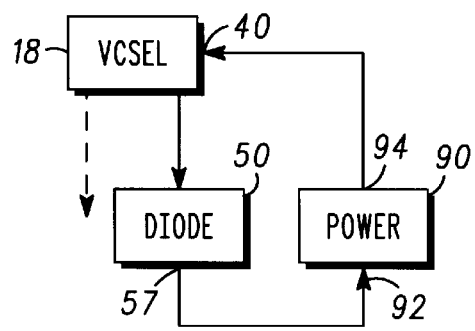
FIG. 6 is a block diagram of the power monitoring system including an automatic power control device.

Referring specifically to FIG. 6, power monitoring systems 62 or 85 can also include a power control device 90 having a control input 92 and a power output 94. Control input 92 is coupled to contact 57 of photodiode 50, and power output 94 is coupled to contact 40 of VCSEL 10. In operation, a portion of the emissions from VCSEL 10 are monitored by photodiode 50 to develop a control signal which is utilized to control power to VCSEL 10 through power control device 90. Since the portion of the emissions from VCSEL 10 received by photodiode 50 is proportional to the portion being utilized at outlet 68, the portion monitored by photodiode 50 can establish the characteristics of the emissions from VCSEL 10.

Thus a system for monitoring the emissions of a VCSEL utilizing a power monitor has been disclosed. Further disclosed is a power monitoring system which will automatically control the emissions of the VCSEL. The power monitor system and automatic power control is inexpensive and easily fabricated.

Various modifications and changes to the embodiments herein chosen for purposes of illustration will readily occur to those skilled in the art. The foregoing is given by way of example only. Other modifications and variations may be made by those skilled in the art without departing from the scope of the invention as defined by the following claims.

Having fully described and disclosed the present invention and preferred embodiments thereof in such clear and concise terms as to enable those skilled in the art to understand and practice same, the invention claimed is:

1. A power monitoring system comprising:
   a vertical cavity surface emitting laser generating an emission;
   a beam splitter optically positioned to receive the emission and split the emission into a first portion and a second portion having a ratio of no greater than 1:9, respectively, the beam splitter including an optical waveguide having a channel split into two channels and defined by a cladding region, the channels being filled with an optically transparent polymer; and
   a monitor optically positioned to receive the first portion of the emission.

2. A power monitoring system as claimed in claim 1 wherein the monitor is a photodiode.

3. A power monitoring system as claimed in claim 1 further including a power control device having a control input and a power output, the control input coupled to an output terminal of the monitor and the power output coupled to the vertical cavity surface emitting laser.

4. A power monitoring system as claimed in claim 1 wherein the optical waveguide includes electrical contacts molded into the cladding region.

5. A power monitoring system as claimed in claim 1 wherein a molded lens is positioned to receive the second portion of the emission.

6. A power monitoring system as claimed in claim 1 wherein an optical fiber is positioned to receive the second portion of the emission.

7. A power monitoring system comprising:
   a vertical cavity surface emitting laser generating an emission;
   an optically transparent polymer waveguide, the waveguide including a branched core enclosed by cladding, the branched core having a light inlet defining an inlet of the waveguide and a pair of light outlets defining first and second outlets of the waveguide, the branched core including a first segment terminating in the first outlet, and a second segment terminating in the second outlet and diverging from the first segment at an angle so as to provide an output ratio of no greater than 1:9, the light inlet of the waveguide being optically coupled to the vertical cavity surface emitting laser, the inlet receiving the emission from the vertical cavity surface emitting laser, and the first and second outlets of the waveguide each providing a portion of the emission received at the inlet, the portion of the emission from the second outlet being no greater than 10% of the emission received at the inlet, and a monitor optically coupled to the waveguide to receive the portion of the emission at the second outlet.

8. A power monitoring system as claimed in claim 7 wherein the monitor is a photodiode.

9. A power monitoring system as claimed in claim 7 wherein a molded lens is optically coupled to the waveguide to receive the portion of the emission at the first outlet.

10. A power monitoring system as claimed in claim 7 wherein an optical fiber is optically coupled to the waveguide to receive the portion of the emission at the first outlet.

* * * * *